(12) United States Patent
Tsai

(10) Patent No.: US 9,941,267 B2
(45) Date of Patent: Apr. 10, 2018

(54) ELECTRO-STATIC DISCHARGE PROTECTION CIRCUIT

(71) Applicant: Taiwan Semiconductor Manufacturing Company Limited, Hsin-Chu (TW)

(72) Inventor: Ming Hsien Tsai, New Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 676 days.

(21) Appl. No.: 14/480,995

(22) Filed: Sep. 9, 2014

(65) Prior Publication Data

US 2016/0071836 A1 Mar. 10, 2016

(51) Int. Cl.
 *H01L 27/02* (2006.01)

(52) U.S. Cl.
 CPC ...... *H01L 27/0266* (2013.01); *H01L 27/0285* (2013.01)

(58) Field of Classification Search
 CPC .............. H01L 27/0266; H01L 27/0285
 See application file for complete search history.

(56) References Cited

U.S. PATENT DOCUMENTS

| | | | |
|---|---|---|---|
| 6,072,676 A * | 6/2000 | Tran | H03F 1/523 323/284 |
| 6,617,906 B1 * | 9/2003 | Hastings | H03K 5/08 327/309 |
| 7,221,551 B2 | 5/2007 | Chen | |
| 2002/0130390 A1 * | 9/2002 | Ker | H01L 27/0255 257/546 |
| 2005/0083620 A1 * | 4/2005 | Lin | H01L 27/0266 361/56 |
| 2010/0246074 A1 * | 9/2010 | Venkatasubramanian | H01L 27/0251 361/56 |
| 2013/0027820 A1 * | 1/2013 | Padilla | H02H 9/046 361/56 |
| 2015/0270258 A1 * | 9/2015 | Dabral | H01L 27/0285 361/56 |

OTHER PUBLICATIONS

A model for leakage control by MOS Transistor Stacking, Purdue University School of Electrical and Computer Engineering, ECE Technical Reports, Mark C. Johnson et al., Dec. 1997.

(Continued)

*Primary Examiner* — Zeev V Kitov
(74) *Attorney, Agent, or Firm* — Cooper Legal Group, LLC

(57) ABSTRACT

An electro-static discharge (ESD) protection circuit is configured to protect circuitry during an ESD event. The ESD protection circuit includes an ESD detection circuit and an ESD clamp circuit. The ESD clamp circuit includes a stack of transistors that is controlled by the ESD detection circuit. A first stack transistor of the stack of transistors includes a deep n-well. The stack of transistors is configured to be activated responsive to detecting the ESD event. The stack of transistors is configured to be deactivated responsive to detecting at least one of normal current conditions or normal voltage conditions. The ESD detection circuit includes a string of diodes. The string of diodes is configured to be activated responsive to detecting the ESD event. The stack of transistors is configured to be a voltage divider responsive to normal voltage conditions.

20 Claims, 5 Drawing Sheets

(56) References Cited

OTHER PUBLICATIONS

ESD Protection Design With on-Chip ESD Bus and High-Voltage-Tolerant ESD Clamp Circuit for Mixed-Voltage I/O Buffers, Ming-Dou Ker et al., IEEE Transactions on Electron Devices, vol. 55, No. 6, Jun. 2008.

ESD Protection for Mixed-Voltage I/O in Low-Voltage Thin-Oxide CMOS, Ming-Dou Ker et al., ISSCC 2006/Session 29/Power Management and Distribution, 2006 IEEE International Solid-State Circuits Conference.

* cited by examiner

ELECTRO-STATIC DISCHARGE PROTECTION CIRCUIT

BACKGROUND

An electro-static discharge (ESD) event is a sudden and unexpected voltage or current that transfers energy to a device. ESD events are known to render a device less operable than desired or inoperable altogether.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
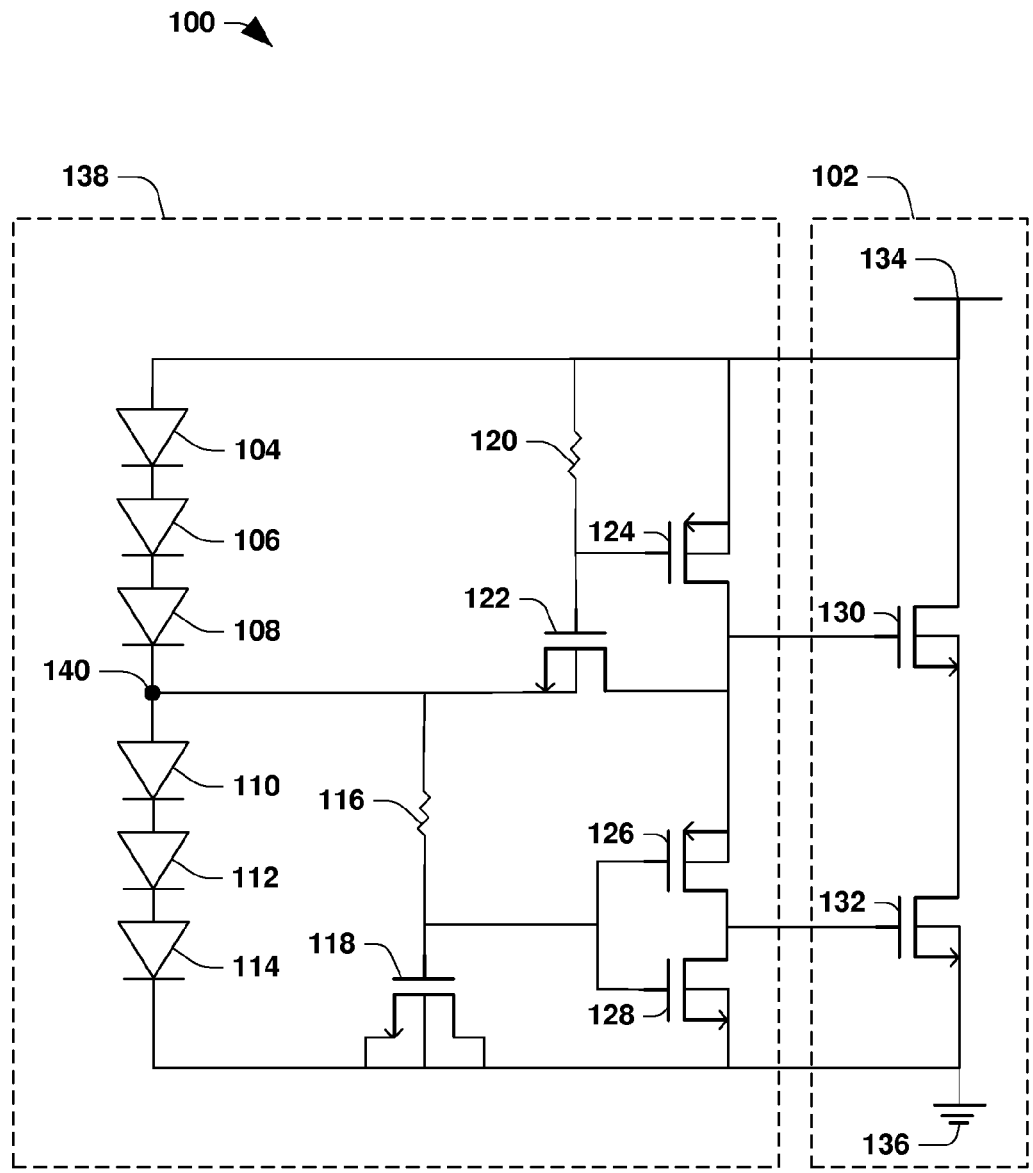
FIG. 1 is an illustration of a circuit schematic of an electro-static discharge (ESD) protection circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an electro-static discharge (ESD) protection circuit is used in association with an integrated circuit (IC) in order to inhibit circuitry of the IC from being damaged by an ESD event. In some embodiments, the IC is a mixed voltage circuit comprising core circuitry and external circuitry, where components of the core circuitry are configured to operate using a core voltage and components of the external circuitry are configured to operate using an external voltage provided by a voltage source. In some embodiments, the core voltage is below the external voltage because at least some components of the core circuitry have smaller sizes than components of the external circuitry. In some embodiments, the ESD protection circuit is connected between the voltage source and ground. In some embodiments, the ESD protection circuit is used to protect one or more of the core circuitry or the external circuitry.

A circuit schematic of an ESD protection circuit 100 is illustrated in FIG. 1, according to some embodiments. In some embodiments, the ESD protection circuit 100 comprises an ESD detection circuit 138 and an ESD clamp circuit 102. In some embodiments, the ESD detection circuit 138 comprises a string of diodes, a first resistor 120, a second resistor 116, a first transistor 122, a second transistor 124, a third transistor 118, a fourth transistor 126 and a fifth transistor 128. In some embodiments, the first transistor 122 is an n-channel metal-oxide-semiconductor field-effect transistor (MOSFET). In some embodiments, the second transistor 124 is a p-channel MOSFET. In some embodiments, the third transistor 118 is an n-channel MOSFET. In some embodiments, the fourth transistor 126 is a p-channel MOSFET. In some embodiments, the fifth transistor 128 is an n-channel MOSFET. In some embodiments, the string of diodes is connected between a first voltage source 134 and a second voltage source 136. In some embodiments, the string of diodes comprises one or more of a first string diode 104, a second string diode 106, a third string diode 108, a fourth string diode 110, a fifth string diode 112 or a sixth string diode 114. In some embodiments, an anode of the first string diode 104 is connected to the first voltage source 134. In some embodiments, a cathode of the first string diode 104 is connected to an anode of the second string diode 106. In some embodiments, a cathode of the second string diode 106 is connected to an anode of the third string diode 108. In some embodiments, a cathode of the third string diode 108 is connected to an anode of the fourth string diode 110 and to a first node 140. In some embodiments, a cathode of the fourth string diode 110 is connected to an anode of the fifth string diode 112. In some embodiments, a cathode of the fifth string diode 112 is connected to an anode of the sixth string diode 114. In some embodiments, a cathode of the sixth string diode 114 is connected to the second voltage source 136. In some embodiments, the second voltage source 136 is ground.

In some embodiments, a first side of the first resistor 120 is connected to the first voltage source 134. In some embodiments, a second side of the first resistor 120 is connected to a gate of the first transistor 122 and to a gate of the second transistor 124. In some embodiments, a body of the first transistor 122 is connected to a source of the first transistor 122. In some embodiments, the source of the first transistor 122 is connected to the cathode of the third string diode 108 and to a first side of the second resistor 116. In some embodiments, a drain of the first transistor 122 is connected to a drain of the second transistor 124. In some embodiments, a source of the second transistor 124 is connected to a body of the second transistor 124. In some embodiments, the source of the second transistor 124 is connected to the first voltage source 134. In some embodiments, a second side of the second resistor 116 is connected to a gate of the third transistor 118. In some embodiments, a source of the third transistor 118 is connected to the second voltage source

136. In some embodiments, a body of the third transistor 118 is connected to the second voltage source 136. In some embodiments, a drain of the third transistor 118 is connected to the second voltage source 136. In some embodiments, the gate of the third transistor 118 is connected to a gate of the fourth transistor 126 and a gate of the fifth transistor 128. In some embodiments, a source of the fourth transistor 126 is connected to a body of the fourth transistor 126. In some embodiments, the source of the fourth transistor 126 is connected to the drain of the first transistor 122. In some embodiments, a drain of the fourth transistor 126 is connected to a drain of the fifth transistor 128. In some embodiments, a body of the fifth transistor 128 is connected to a source of the fifth transistor 128. In some embodiments, a source of the fifth transistor 128 is connected to the second voltage source 136.

In some embodiments, the ESD clamp circuit 102 comprises a stack of transistors. In some embodiments, the stack of transistors comprises a first stack transistor 130 and a second stack transistor 132. In some embodiments, the first stack transistor 130 is an n-channel MOSFET. In some embodiments, the second stack transistor 132 is an n-channel MOSFET. In some embodiments, a drain of the first stack transistor 130 is connected to the first voltage source 134. In some embodiments, a body of the first stack transistor 130 is connected to a source of the first stack transistor 130. Rather than connecting the body of the first stack transistor 130 to the source of the first stack transistor 130 as illustrated in FIG. 1, in some embodiments, the body of the first stack transistor 130 is connected to a source of the second stack transistor 132. In some embodiments, the source of the first stack transistor 130 is connected to a drain of the second stack transistor 132. In some embodiments, a body of the second stack transistor 132 is connected to the source of the second stack transistor 132. In some embodiments, the source of the second stack transistor 132 is connected to the second voltage source 136. In some embodiments, a gate of the first stack transistor 130 is connected to the drain of the first transistor 122. In some embodiments, a gate of the second stack transistor 132 is connected to the drain of the fourth transistor 126.

In some embodiments, the ESD protection circuit 100 is a mixed voltage circuit. In some embodiments, the ESD detection circuit 138 comprises core circuitry and the ESD clamp circuit 102 comprises external circuitry. In some embodiments, one or more components of the ESD detection circuit 138 are smaller in size than one or more components of the ESD clamp circuit 102. In some embodiments, an operating voltage of one or more components of the ESD detection circuit 138 corresponds to a core voltage. In some embodiments, an operating voltage of one or more components of the ESD clamp circuit 102 corresponds to an external voltage. In some embodiments, a first source voltage of the first voltage source 134 corresponds to the external voltage. In some embodiments, applying the first source voltage across one or more components of the ESD detection circuit 138 may damage them. In some embodiments, the first source voltage is substantially equal to 1.8 V. In some embodiments, the first source voltage is above 1.8 V. In some embodiments, the first source voltage is below 1.8 V. In some embodiments, a second source voltage of the second voltage source 136 is 0 V. In some embodiments, the second source voltage is below 0 V. In some embodiments, the second source voltage is above 0 V. In some embodiments, the core voltage is substantially equal to 0.9 V. In some embodiments, the core voltage is above 0.9 V. In some embodiments, the core voltage is below 0.9 V.

In some embodiments, the ESD detection circuit 138 is configured to control a state of the stack of transistors. In some embodiments, the ESD detection circuit 138 is configured to activate the stack of transistors responsive to detecting an ESD event. In some embodiments, the ESD detection circuit 138 is configured to deactivate the stack of transistors responsive to detecting normal voltage conditions. In some embodiments, the ESD detection circuit 138 is configured to deactivate the stack of transistors responsive to detecting normal current conditions. In some embodiments, the stack of transistors is activated when one or more of the first stack transistor 130 or the second stack transistor 132 is activated. In some embodiments, the stack of transistors is deactivated when one or more of the first stack transistor 130 or the second stack transistor 132 is deactivated.

In some embodiments, the string of diodes is configured to be deactivated responsive to detecting normal voltage conditions. In this way, when the ESD protection circuit 100 has normal voltage conditions, current is unable to pass through the string of diodes from the first voltage source 134 to the second voltage source 136. In some embodiments, the string of diodes is configured to be deactivated responsive to detecting normal current conditions. In this way, when the ESD protection circuit 100 has normal current conditions, current is unable to pass through the string of diodes from the first voltage source 134 to the second voltage source 136. In some embodiments, the string of diodes is deactivated when one or more string diodes of the string of diodes are deactivated. In some embodiments, the string of diodes is configured to be activated responsive to detecting an ESD event. In this way, in some embodiments, when the ESD protection circuit 100 undergoes the ESD event, current passes through the string of diodes from the first voltage source 134 to the second voltage source 136. In some embodiments, the string of diodes is activated when one or more string diodes of the string of diodes are activated.

In some embodiments, a number of string diodes within the string of diodes depends on the first source voltage of the first voltage source 134 and a forward-biased threshold voltage corresponding to one or more string diodes of the string of diodes. In some embodiments, a product of the forward-biased threshold voltage and the number of string diodes is above the first source voltage. In this way, during normal voltage conditions, the string of diodes is deactivated. In some embodiments, during normal current conditions, the string of diodes is deactivated. In some embodiments, the product of the forward-biased threshold voltage and the number of string diodes is substantially equal to a threshold voltage of the string of diodes. In some embodiments, responsive to the first source voltage being substantially equal to or above the threshold voltage of the string of diodes, the string of diodes is activated. In some embodiments, six or more string diodes are comprised in the string of diodes. In some embodiments, fewer than six string diodes are comprised in the string of diodes.

In some embodiments, the string of diodes is configured to be a voltage divider responsive to detecting normal voltage conditions. In some embodiments, the string of diodes is configured to be a voltage divider responsive to detecting normal current conditions. In some embodiments, the string of diodes is configured to provide a specified voltage at the first node 140. In some embodiments, maintaining the specified voltage at the first node 140 keeps voltages across one or more components of the ESD detection circuit 138 from exceeding the core voltage.

Figure 2:
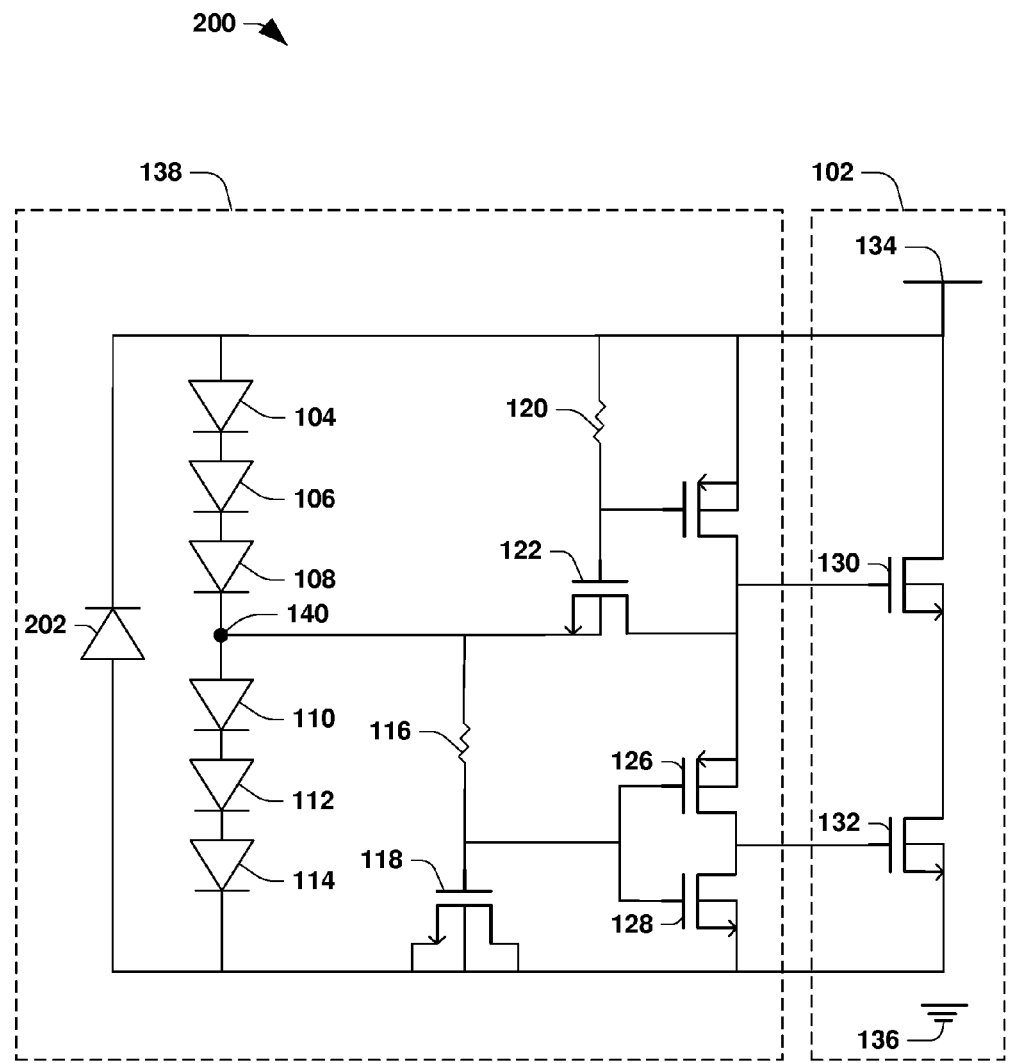
FIG. 2 is an illustration of a circuit schematic of an ESD protection circuit, in accordance with some embodiments.

A circuit schematic of an ESD protection circuit 200 is illustrated in FIG. 2, according to some embodiments. In some embodiments, the ESD protection circuit 200 comprises the ESD protection circuit 100 and a diode 202 connected within the ESD detection circuit 138. In some embodiments, a cathode of the diode 202 is connected to the first voltage source 134. In some embodiments, an anode of the diode 202 is connected to the second voltage source 136.

In some embodiments, the diode 202 is configured to be activated responsive to detecting an ESD event. In some embodiments, the diode 202 is configured to be activated responsive to the second voltage source 136 having the second source voltage that is greater than a sum of the first source voltage and a forward-biased threshold voltage corresponding to the diode 202.

Figure 3:
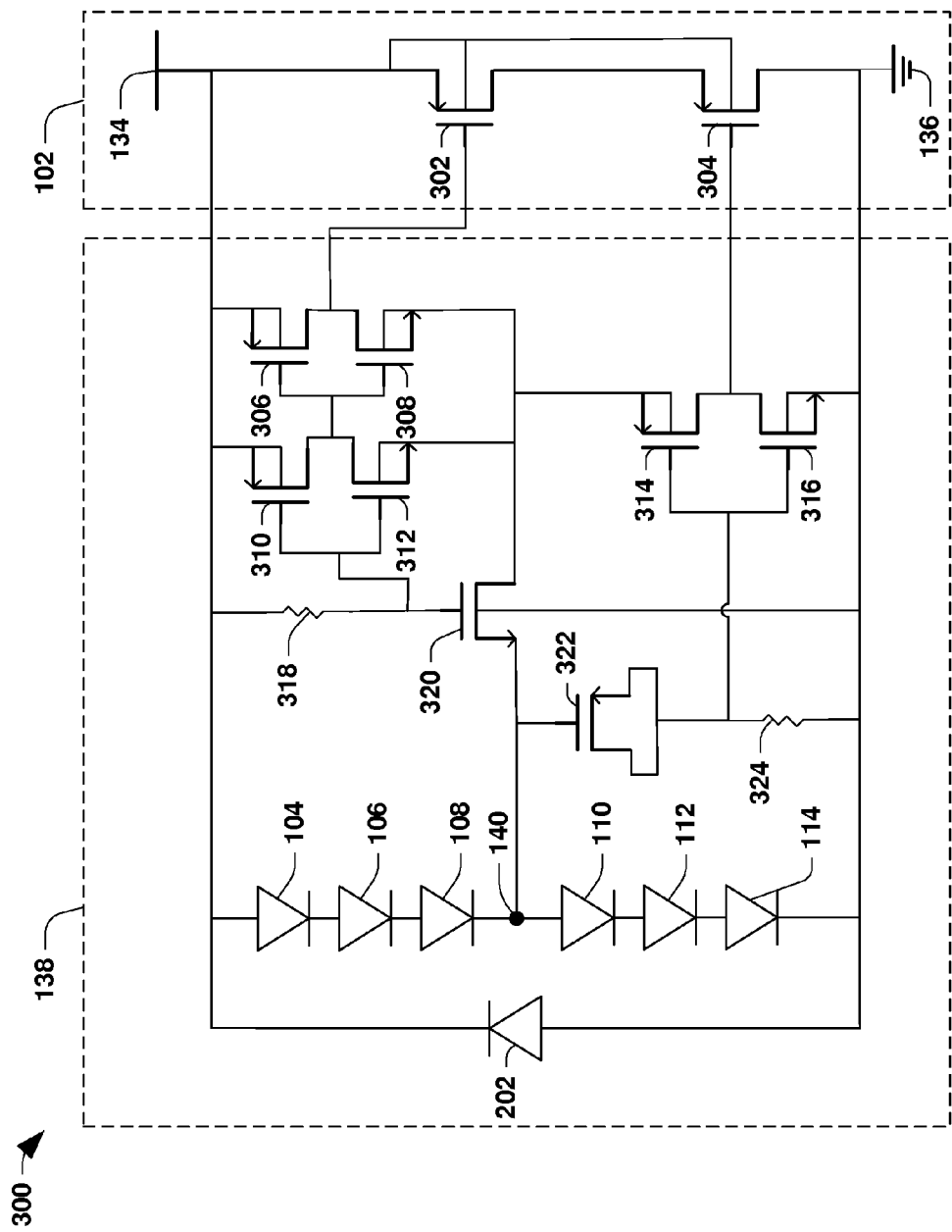
FIG. 3 is an illustration of a circuit schematic of an ESD protection circuit, in accordance with some embodiments.

In some embodiments, p-channel MOSFETs are used for the stack of transistors. A circuit schematic of an ESD protection circuit 300 is illustrated in FIG. 3, according to some embodiments. In some embodiments, the ESD protection circuit 300 comprises the ESD detection circuit 138 and the ESD clamp circuit 102. In some embodiments, the ESD detection circuit 138 comprises the diode 202, the string of diodes, a sixth transistor 322, a seventh transistor 320, an eighth transistor 310, a ninth transistor 312, a tenth transistor 306, an eleventh transistor 308, a twelfth transistor 314, a thirteenth transistor 316, a third resistor 324 and a fourth resistor 318. In some embodiments, the sixth transistor 322 is a p-channel MOSFET. In some embodiments, the seventh transistor 320 is an n-channel MOSFET. In some embodiments, the eighth transistor 310 is a p-channel MOSFET. In some embodiments, the ninth transistor 312 is an n-channel MOSFET. In some embodiments, the tenth transistor 306 is a p-channel MOSFET. In some embodiments, the eleventh transistor 308 is an n-channel MOSFET. In some embodiments, the twelfth transistor 314 is a p-channel MOSFET. In some embodiments, the thirteenth transistor 316 is an n-channel MOSFET. In some embodiments, the string of diodes is connected between the first voltage source 134 and the second voltage source 136. In some embodiments, the string of diodes comprises the first string diode 104, the second string diode 106, the third string diode 108, the fourth string diode 110, the fifth string diode 112 and the sixth string diode 114. In some embodiments, the anode of the first string diode 104 is connected to the first voltage source 134. In some embodiments, the cathode of the first string diode 104 is connected to the anode of the second string diode 106. In some embodiments, the cathode of the second string diode 106 is connected to the anode of the third string diode 108. In some embodiments, the cathode of the third string diode 108 is connected to the anode of the fourth string diode 110 and to the first node 140. In some embodiments, the cathode of the fourth string diode 110 is connected to the anode of the fifth string diode 112. In some embodiments, the cathode of the fifth string diode 112 is connected to the anode of the sixth string diode 114. In some embodiments, the cathode of the sixth string diode 114 is connected to the second voltage source 136.

In some embodiments, a first side of the third resistor 324 is connected to the second voltage source 136. In some embodiments, a second side of the third resistor 324 is connected to a drain of the sixth transistor 322 and to a source of the sixth transistor 322. In some embodiments, the second side of the resistor 324 is connected to a gate of the twelfth transistor 314 and to a gate of the thirteenth transistor 316. In some embodiments, a gate of the sixth transistor 322 is connected to the first node 140 and to a drain of the seventh transistor 320. In some embodiments, a gate of the seventh transistor 320 is connected to a gate of the eighth transistor 310, to a gate of the ninth transistor 312 and to a first side of the fourth resistor 318. In some embodiments, a body of the seventh transistor 320 is connected to the second voltage source 136. In some embodiments, a source of the eighth transistor 310 is connected to the first voltage source 134 and to a body of the eighth transistor 310. In some embodiments, a drain of the eighth transistor 310 is connected to a drain of the ninth transistor 312, to a gate of the tenth transistor 306 and to a gate of the eleventh transistor 308. In some embodiments, a body of the ninth transistor 312 is connected to a source of the ninth transistor 312, to a source of the eleventh transistor 308, to a drain of the seventh transistor 320, to a source of the twelfth transistor 314 and to a body of the twelfth transistor 314. In some embodiments, a source of the tenth transistor 306 is connected to the first voltage source 134 and to a body of the tenth transistor 306. In some embodiments, a drain of the tenth transistor 306 is connected to a drain of the eleventh transistor 308. In some embodiments, a drain of the twelfth transistor 314 is connected to a drain of the thirteenth transistor 316. In some embodiments, a source of the thirteenth transistor 316 is connected to a body of the thirteenth transistor 316 and to the second voltage source 136.

In some embodiments, the ESD clamp circuit 102 comprises a stack of transistors. In some embodiments, the stack of transistors comprises a third stack transistor 302 and a fourth stack transistor 304. In some embodiments, the third stack transistor 302 is a p-channel MOSFET. In some embodiments, the fourth stack transistor 304 is a p-channel MOSFET. In some embodiments, a gate of the third stack transistor 302 is connected to the drain of the tenth transistor 306. In some embodiments, a source of the third stack transistor 302 is connected to one or more of the first voltage source 134, a body of the third stack transistor 302 or a body of the fourth stack transistor 304. In some embodiments, a drain of the third stack transistor 302 is connected to a source of the fourth stack transistor 304. In some embodiments, a gate of the fourth stack transistor 304 is connected to a drain of the twelfth transistor 314. In some embodiments, a drain of the fourth stack transistor 304 is connected to a second voltage source 136.

In some embodiments, the first transistor 122 comprises a deep n-well. In some embodiments, having a deep n-well increases protection against leakage current of the first transistor 122. In some embodiments, the first stack transistor 130 comprises a deep n-well. In some embodiments, having a deep n-well increases protection against leakage current of the first stack transistor 130.

Figure 4:
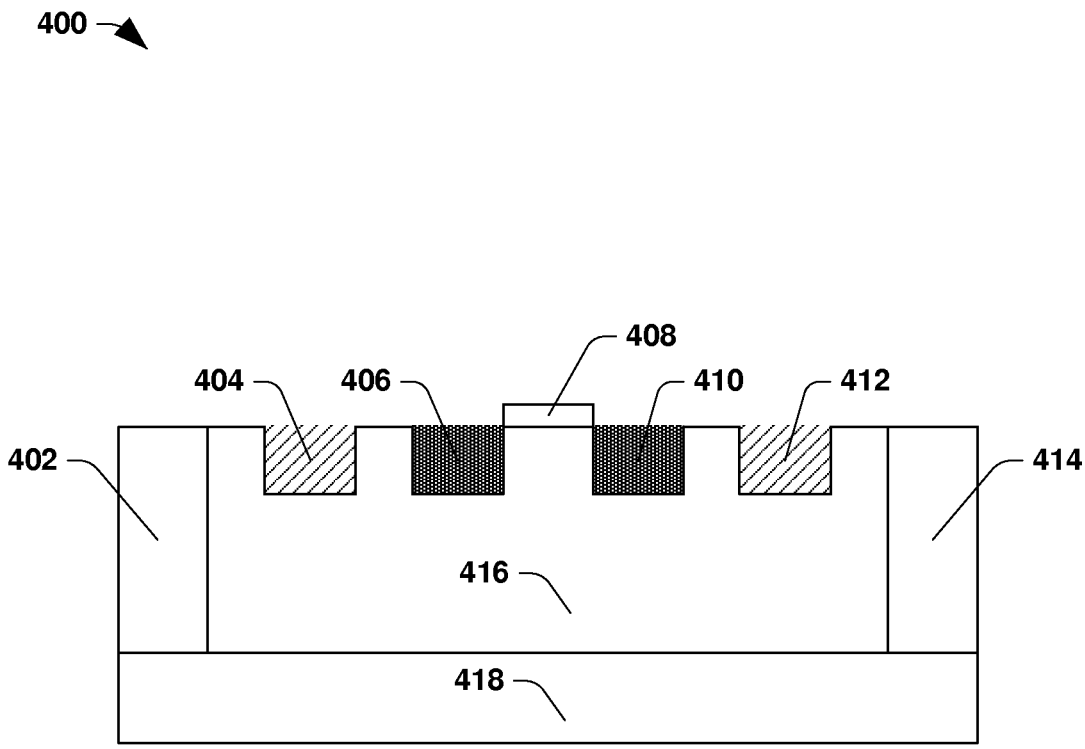
FIG. 4 is an illustration of a cross-sectional view of a portion of an n-channel metal-oxide-semiconductor field-effect transistor (MOSFET), in accordance with some embodiments.

A cross-sectional view of a portion of an n-channel MOSFET 400 comprising a deep n-well is illustrated in FIG. 4, according to some embodiments. In some embodiments, the n-channel MOSFET 400 comprises one or more of a first n-well 402, a second n-well 414, a p-well 416, a deep n-well 418, a first doped p-type semiconductor segment 404, a second doped p-type semiconductor segment 412, a first doped n-type semiconductor segment 406, a second doped n-type semiconductor segment 410 or a gate stack 408.

In some embodiments, the p-well 416 defines one or more of a first trench, a second trench, a third trench or a fourth trench. In some embodiments, the first doped p-type semiconductor segment 404 is disposed within the first trench. In some embodiments, the first doped n-type semiconductor segment 406 is disposed within the second trench. In some embodiments, the second doped n-type semiconductor segment 410 is disposed within the third trench. In some embodiments, the second doped p-type semiconductor segment 412 is disposed within the fourth trench. In some embodiments, the first doped p-type semiconductor segment 404 is disposed diametrically opposite the second doped p-type semiconductor segment 412. In some embodiments, the first doped n-type semiconductor segment 406 is disposed diametrically opposite the second doped n-type semiconductor segment 410. In some embodiments, the first n-well 402 is disposed adjacent to the p-well 416. In some embodiments, the second n-well 414 is disposed adjacent to the p-well 416. In some embodiments, the second n-well 414 is disposed diametrically opposite the first n-well 402. In some embodiments, the gate stack 408 is disposed above the p-well 416. In some embodiments, the deep n-well 418 is disposed below one or more of the first n-well 402, the second n-well 414 or the p-well 416. In some embodiments, the deep n-well 418 is in contact with one or more of the first n-well 402, the second n-well 414 or the p-well 416.

In some embodiments, the string of diodes comprises a deep n-well. In some embodiments, having a deep n-well increases protection against leakage current of the string of diodes.

Figure 5:
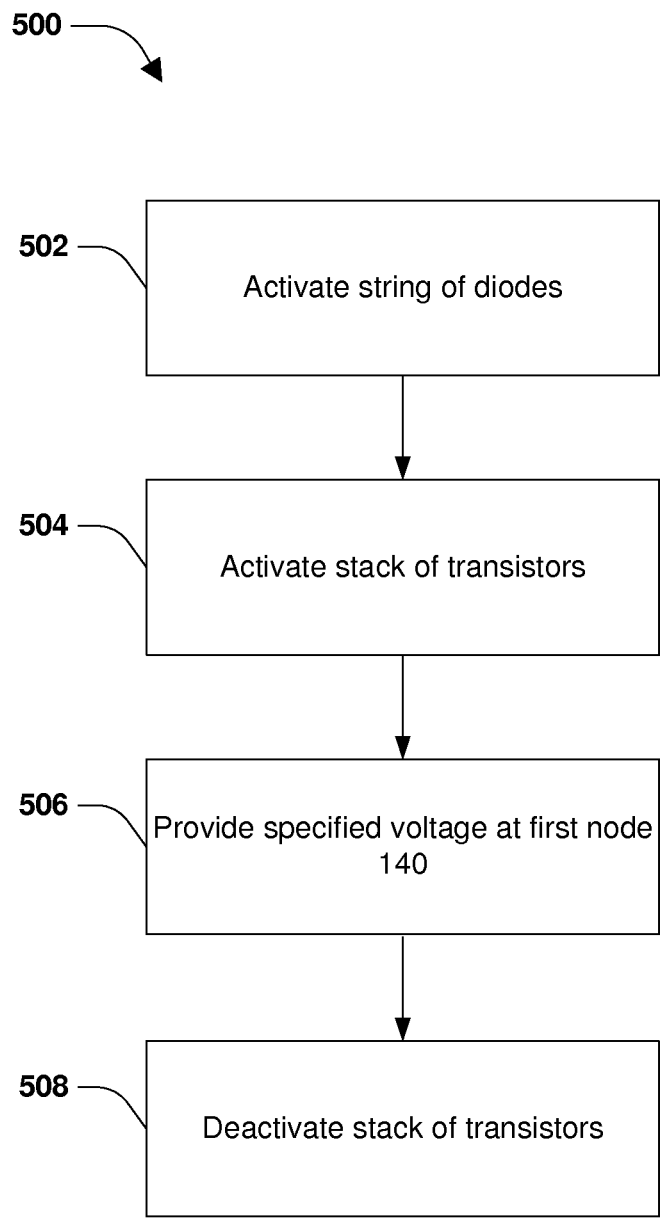
FIG. 5 is an illustration of a method, in accordance with some embodiments.

A method 500 of operating the ESD protection circuit 100 is illustrated in FIG. 5, according to some embodiments. In some embodiments, at 502, the string of diodes is activated responsive to detecting an ESD event, such that current can pass through the string of diodes from the first voltage source 134 to the second voltage source 136. In some embodiments, at 504, the stack of transistors is activated responsive to detecting a second ESD event such that current can pass through the stack of transistors from the first voltage source 134 to the second voltage source 136. In some embodiments, the string of diodes is configured to be deactivated responsive to detecting normal voltage conditions. In some embodiments, the string of diodes is configured to be deactivated responsive to detecting normal current conditions. In some embodiments, at 506, the string of diodes is configured to provide the specified voltage at the first node 140 responsive to detecting normal voltage conditions. In some embodiments, at 506, the string of diodes is configured to provide the specified voltage at the first node 140 responsive to detecting normal current conditions. In some embodiments, at 508, the stack of transistors is deactivated so that current is blocked from flowing through the stack of transistors from the first voltage source 134 to the second voltage source 136. In some embodiments, the ESD event is the same as the second ESD event. In some embodiments, the ESD event is different than the second ESD event.

In some embodiments, an ESD protection circuit is provided. In some embodiments, the ESD protection circuit comprises an ESD clamp circuit comprising a stack of transistors comprising a first stack transistor comprising a deep n-well. In some embodiments, a gate of the first stack transistor is connected to an ESD detection circuit. In some embodiments, the ESD protection circuit comprises the ESD detection circuit. In some embodiments, the ESD detection circuit is configured to activate the stack of transistors responsive to detecting an ESD event and deactivate the stack of transistors responsive to detecting at least one of normal current conditions or normal voltage conditions.

In some embodiments, an ESD protection circuit is provided. In some embodiments, the ESD protection circuit comprises an ESD detection circuit. In some embodiments, the ESD detection circuit comprises a string of diodes connected between a first voltage source and a second voltage source, where the string of diodes is configured to provide a specified voltage at a first node. In some embodiments, the ESD detection circuit comprises a first transistor, a gate of the first transistor connected to the first voltage source via zero or more resistors and a source of the first transistor connected to the first node. In some embodiments, the ESD protection circuit comprises an ESD clamp circuit, connected to the ESD detection circuit, comprising a stack of transistors connected between the first voltage source and a second voltage source.

In some embodiments, a method of operating an ESD protection circuit is provided. In some embodiments, the method comprises activating a string of diodes to allow current to pass through the string of diodes from a first voltage source to a second voltage source responsive to detecting an ESD event. In some embodiments, the method comprises providing a specified voltage at a first node of the string of diodes responsive to detecting at least one of normal current conditions or normal voltage conditions.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An electro-static discharge (ESD) protection circuit, comprising:
   an ESD clamp circuit comprising a stack of transistors; and
   an ESD detection circuit, comprising:
      a string of diodes, wherein a first end of the string of diodes is coupled to a first source/drain region of a first stack transistor of the stack of transistors;
      a first transistor comprising a first source/drain region coupled to a first node between a first diode of the string of diodes and a second diode of the string of diodes, wherein a second source/drain region of the first transistor is coupled to a gate of the first stack transistor; and
      a second transistor comprising a first source/drain region coupled to the second source/drain region of the first transistor and the gate of the first stack transistor, wherein:
         a second source/drain region of the second transistor is coupled to the first end of the string of diodes and the first source/drain region of the first stack transistor; and
         a gate of the second transistor is coupled to a gate of the first transistor.

2. The ESD protection circuit of claim 1, wherein the first source/drain region of the first stack transistor and the first end of the string of diodes are commonly coupled to a first voltage source.

3. The ESD protection circuit of claim 1, wherein the stack of transistors comprises a second stack transistor coupled in series with the first stack transistor.

4. The ESD protection circuit of claim 3, wherein a first source/drain region of the second stack transistor is coupled to a second source/drain region of the first stack transistor and a second source/drain region of the second stack transistor is coupled to a second end of the string of diodes.

5. The ESD protection circuit of claim 4, wherein a body of the first stack transistor is coupled to the second source/drain region of the first stack transistor.

6. The ESD protection circuit of claim 3, wherein the first stack transistor is an n-channel metal-oxide-semiconductor field-effect transistor (MOSFET) and the second stack transistor is a second n-channel MOSFET.

7. An electro-static discharge (ESD) protection circuit, comprising:
   an ESD detection circuit, comprising:
      a string of diodes coupled between a first voltage source and a second voltage source; and
      a first transistor, wherein:
         a gate of the first transistor is coupled to the first voltage source,
         a first source/drain region of the first transistor is coupled to a first node between a first diode of the string of diodes and a second diode of the string of diodes, and
         a gate of the first transistor is coupled to a gate of a second transistor that is coupled between the first voltage source and a second source/drain region of the first transistor; and
   an ESD clamp circuit coupled to the ESD detection circuit, wherein the ESD clamp circuit comprises a stack of transistors coupled between the first voltage source and the second voltage source.

8. The ESD protection circuit of claim 7, wherein the string of diodes comprises a deep n-well.

9. The ESD protection circuit of claim 7, wherein the first transistor comprises a deep n-well.

10. The ESD protection circuit of claim 7, wherein:
    the stack of transistors comprises a first stack transistor,
    a first source/drain region of the first stack transistor is coupled to the first voltage source, and
    a gate of the first stack transistor is coupled to the second source/drain region of the first transistor.

11. The ESD protection circuit of claim 10, wherein:
    the stack of transistors comprises a second stack transistor,
    a first source/drain of the second stack transistor is coupled to a second source/drain region of the first stack transistor,
    a gate of the second stack transistor is coupled to the ESD detection circuit, and
    a body of the second stack transistor is coupled to a second source/drain region of the second stack transistor and to the second voltage source.

12. The ESD protection circuit of claim 10, wherein the first stack transistor comprises a deep n-well.

13. The ESD protection circuit of claim 7, wherein:
    the ESD detection circuit comprises a third transistor,
    a first source/drain region of the third transistor is coupled to the second source/drain region of the first transistor,
    the ESD clamp circuit comprises a first stacked transistor, and
    a second source/drain region of the third transistor is coupled to a gate of the first stacked transistor.

14. The ESD protection circuit of claim 13, wherein the first source/drain region of the first transistor is coupled to a gate of the third transistor.

15. The ESD protection circuit of claim 13, wherein:
    the ESD detection circuit comprises a resistor,
    the first diode, the second diode, and the first source/drain region of the first transistor are commonly coupled at the first node, and
    a gate of the third transistor is coupled to the first node through the resistor.

16. The ESD protection circuit of claim 13, wherein:
    the ESD clamp circuit comprises a second stacked transistor,
    the second source/drain region of the first transistor is coupled to a gate of the second stacked transistor, and
    the first source/drain region of the third transistor is coupled to the gate of the second stacked transistor.

17. The ESD protection circuit of claim 16, wherein the first stacked transistor is arranged in series with the second stacked transistor.

18. An electro-static discharge (ESD) protection circuit, comprising:
   an ESD detection circuit, comprising:
      a string of diodes coupled between a first voltage source and a second voltage source;
      a first transistor;
      a second transistor; and
      a third transistor, wherein:
         a gate of the first transistor is coupled to the first voltage source,
         a first source/drain region of the first transistor and a gate of the second transistor are coupled to a first node between a first diode of the string of diodes and a second diode of the string of diodes, and
         a first source/drain region of the second transistor is coupled to a gate of the third transistor; and
   an ESD clamp circuit coupled to the ESD detection circuit, wherein the ESD clamp circuit comprises a first stack transistor and a second stack transistor.

19. The ESD protection circuit of claim 18, wherein a second source/drain region of the first transistor is coupled to a gate of the first stack transistor.

20. The ESD protection circuit of claim 18, the ESD detection circuit comprising a fourth transistor coupled between the first voltage source and a second source/drain region of the first transistor, wherein a gate of the fourth transistor is coupled to the gate of the first transistor.

* * * * *